(12) United States Patent
Pyi

(10) Patent No.: US 6,969,666 B2
(45) Date of Patent: Nov. 29, 2005

(54) METHOD FOR FABRICATING ISOLATION LAYER IN SEMICONDUCTOR DEVICE

(75) Inventor: Seung Ho Pyi, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 61 days.

(21) Appl. No.: 10/703,743

(22) Filed: Nov. 7, 2003

(65) Prior Publication Data

US 2004/0203225 A1    Oct. 14, 2004

(30) Foreign Application Priority Data

Apr. 14, 2003  (KR) .................. 10-2003-0023491

(51) Int. Cl.⁷ .............................................. H01L 21/76
(52) U.S. Cl. ................. 438/424; 438/425; 438/426; 438/427
(58) Field of Search .................. 438/424–427, 438/429–437, 353–362

(56) References Cited

U.S. PATENT DOCUMENTS

| | | | |
|---|---|---|---|
| 6,180,493 B1 * | 1/2001 | Chu ..................... | 438/437 |
| 6,437,381 B1 | 8/2002 | Gruening et al. | |
| 6,583,464 B1 | 6/2003 | Bertagnolli et al. | |
| 6,586,300 B1 | 7/2003 | Hummler et al. | |
| 6,600,199 B2 | 7/2003 | Voldman et al. | |
| 6,602,748 B2 | 8/2003 | Watatani | |
| 6,602,759 B2 | 8/2003 | Ajmera et al. | |
| 2004/0041233 A1 * | 3/2004 | Porter ..................... | 257/530 |

FOREIGN PATENT DOCUMENTS

| | | |
|---|---|---|
| JP | 5102296 | 4/1993 |
| JP | 2000 58635 | 2/2000 |
| JP | 2001 110892 | 4/2001 |

* cited by examiner

Primary Examiner—Dung A. Le
(74) Attorney, Agent, or Firm—Ladas & Parry LLP

(57) ABSTRACT

A method for fabricating an isolation layer in a semiconductor device is disclosed. The method comprises the steps of: forming a pad oxide film and a pad nitride film sequentially on a semiconductor substrate defining a cell region and a peripheral region; forming a trench on the semiconductor substrate by etching the pad oxide film, the pad nitride film and the substrate; forming an oxide film of side walls on a surface of the trench; depositing an amorphous silicon film on a resultant substrate inclusive of the trench; etching the amorphous silicon film so that the trench is partly filled; depositing an insulation film on a resultant substrate so that the partly filled trench is filled completely; carrying out a CMP process of the insulation film to expose the pad nitride film; and removing the pad nitride film.

7 Claims, 4 Drawing Sheets

METHOD FOR FABRICATING ISOLATION LAYER IN SEMICONDUCTOR DEVICE

BACKGROUND OF THE INVENTION

1. Field of the Invention

The present invention relates to a method for fabricating a field oxide in a semiconductor device, and more particularly to a method for fabricating a field oxide in a semiconductor device which can alleviate stresses of the field oxide and enhance ability to isolate the semiconductor device.

2. Description of the Prior Art

As generally known in the art, an isolation layer in a semiconductor device, which isolates an element from another element, takes on more and more important roles as the degree of integration of the semiconductor device increases.

Conventionally, although an LOCOS (Local Oxidation of Silicon) process which utilizes oxidation inhibiting layer such as nitride layer in order to oxidize an isolation region, thereby forming an isolation layer, is used to fabricate an isolation layer in a semiconductor device, however, limitations exist in this conventional method as the degree of integration increases.

Therefore, an STI (Shallow Trench Isolation) process is suggested to solve limitations existed in this conventional art. As the STI process can solve problems occurring in the LOCOS process and can be utilized to a device with considerably high degree of integration, the STI process is nowadays the most widely utilized isolation process.

However, limitations also exist in the STI process due to increase of the degree of integration of the semiconductor device. For example, although an inner part of a trench should be filled up with an oxide layer formed by a CVD (Chemical Vapor deposition) process, it is not easy to fill up the trench with the oxide film when there is a significant decrease of the width of the trench, and therefore limitations exist in filling up the trench to cope with present technological requirements.

Further, as the width of the field oxide of the trench decreases, a probability that the strength of an electric field produced from a cell may affect neighboring cells increases. Therefore, as the semiconductor device is scaled down, a probability that side walls of the field oxide may be under an inversion condition due to the electric field produced from the neighboring cells increases, thereby degrading the characteristics of the semiconductor device.

Also, the influences of the electric field produced from the peripheral cells to a neighboring MOSFET are liable to increase, thereby increasing the possibility of abnormal operation of the semiconductor device.

To solve these problems occurring in the conventional trench isolation process, another conventional method for depositing the inner part of the trench with polysilicon is disclosed in "Tech. Digest of IEDM" by Yongjik PARK and Kinam KIM, pp. 391–394(2001).

However, in the case of depositing polysilicon on a narrow area, such as the trench, too much stress is produced in the neighboring devices when grains grow in a subsequent thermal process, thereby deteriorating refresh characteristics of the semiconductor device.

SUMMARY OF THE INVENTION

Accordingly, the present invention has been made to solve the above-mentioned problems occurring in the prior art, and an object of the present invention is to provide a method for fabricating a field oxide in a semiconductor device which can alleviate stresses and enhance an ability to isolate the semiconductor device.

In order to accomplish this object, there is provided a method for fabricating an isolation layer in a semiconductor device, the method comprising the steps of: forming a pad oxide film and a pad nitride film sequentially on a semiconductor substrate defining a cell region and a peripheral region; forming a trench on the semiconductor substrate by etching the pad oxide film, the pad nitride film and the substrate; forming an oxide film of side walls on a surface of the trench; depositing an amorphous silicon film on a resultant substrate inclusive of the trench; etching the amorphous silicon film so that the trench is partly filled; depositing an insulation film on a resultant substrate so that the partly filled trench is filled completely; carrying out a CMP process of the insulation film to expose the pad nitride film; and removing the pad nitride film.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
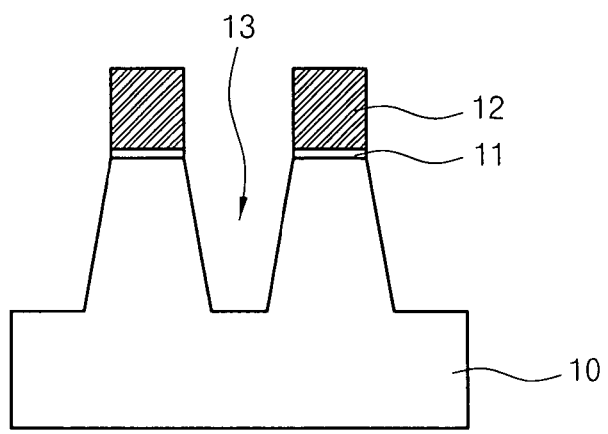
FIGS. 1A through 1G are cross-sectional views of process each showing a method for fabricating an isolation layer in a semiconductor device according to a preferred embodiment of the present invention.

Hereinafter, a preferred embodiment of the present invention will be described with reference to the accompanying drawings. In the following description and drawings, the same reference numerals are used to designate the same or similar components, and so repetition of the description on the same or similar components will be omitted.

Referring to FIG. 1A, a pad oxide film 11 and a pad nitride film 12 are sequentially formed on a silicon substrate 10, and then the pad nitride film 12, the pad oxide film 11 and the silicon substrate 10 are etched by a masking process and an etching process, thereby forming a trench 13 on the silicon substrate 10.

Figure 1B:
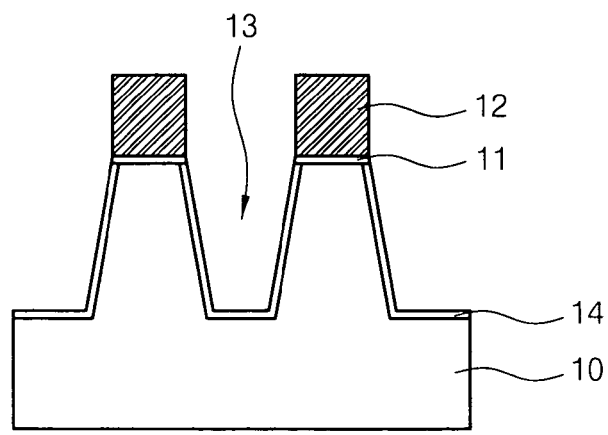

Referring now to FIG. 1B, an oxidation process of side walls is carried out in relation to a resultant substrate, thereby forming an oxide film 14 of the side walls on a surface of the trench 13.

Figure 1C:
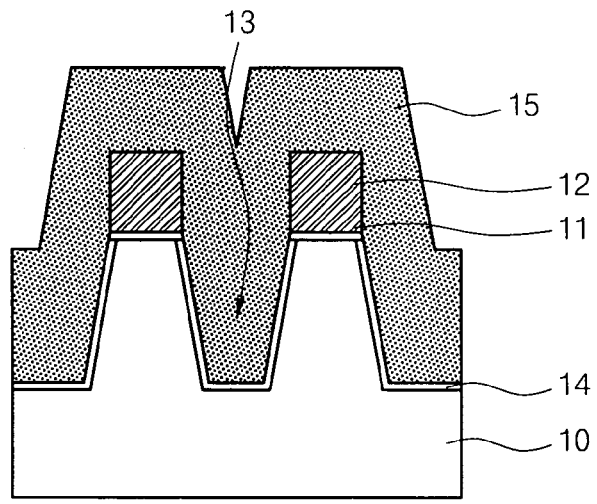

Referring to FIG. 1C, an amorphous silicon film 15 is deposited on the whole resultant substrate, inclusive of the trench 13, according to an LPCVD process in an atmosphere of mixed gas made of $SiH_4$ and $N_2$ to a temperature ranging from 500° C. to 600° C.

Herein, the amorphous silicon film 15 is deposited to a thickness thinner than a depth of the trench 13. This is because the amorphous silicon film 15 can be short-circuited with a gate electrode (not shown), in a case wherein the amorphous silicon film 15 is formed thicker than the depth of the trench 13.

Accordingly, the amorphous silicon film 15 formed on a cell region, in which isolation of the device is important, is deposited thicker than half a width of the field oxide of the semiconductor device, and the amorphous silicon film 15 on peripheral region is preferably deposited thinner than the thickness of the amorphous silicon film deposited on the cell region. For example, in a case wherein the width of the trench 13 is 120 nm, the amorphous silicon film 15 is preferably deposited to more than 60 nm.

As described above, when an inner part of the trench 13 is filled up with the amorphous silicon film 15, a doping concentration of the amorphous silicon film 15 becomes high according to subsequent ion implantation, etc., thereby making the Debye length Ld short, as denoted by the below equation:

$$Ld=(\epsilon s \cdot Vt/qNA)^{1/2},$$

wherein Ld represents a Debye length, εs refers to a relative permittivity of silicon, Vt refers to a thermal voltage, NA refers to a concentration of dopant.

As apparent from the above equation, the Debye length means a length that decreases to a quantity of 1/e of a strength of electric field. Therefore, when the Debye length is short, an effect of shielding the electric field is large, and it can be easily understood that the inversion of the sidewalls of the trench or the electrical effect of the neighboring cell to the MOSFET becomes smaller as long as the effect of shielding the electric field becomes larger.

Figure 1D:
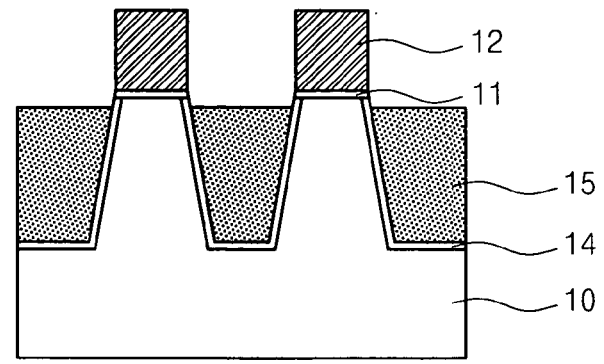

Referring now to FIG. 1D, the amorphous silicon film is etched to a portion below a surface of the substrate of the cell region, thereby making the trench 13 to be filled up partly with the amorphous silicon film 15.

Figure 1E:
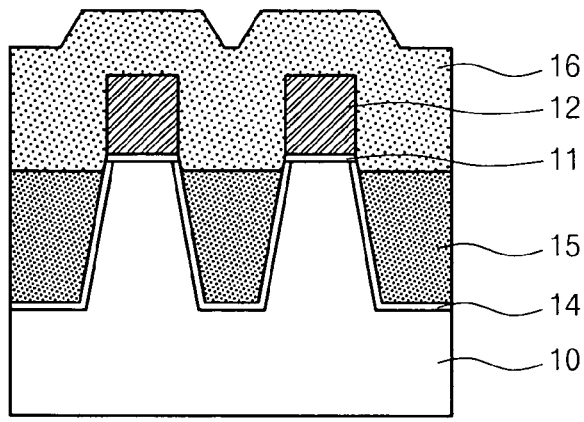

Referring to FIG. 1E, an oxide film is deposited as an insulation film on the resultant substrate inclusive of the partly filled up trench 13 to a thickness ranging from 3000 to 5000 Å according to an LPCVD process. In this instance, the oxide film 16 is formed in order to prevent the amorphous silicon film 15 partly filled up within the trench 13 from being short-circuited with a gate electrode formed in a subsequent process.

Figure 1F:
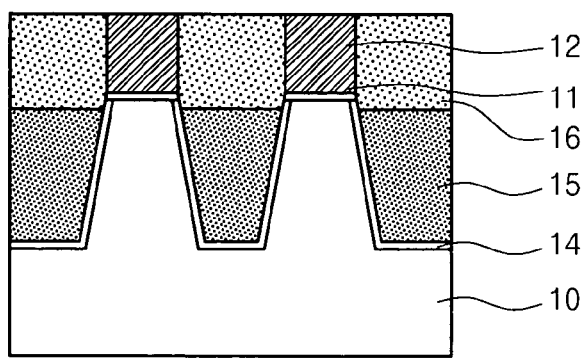

Referring to FIG. 1F, a CMP (Chemical Mechanical Polishing) process for removing oxide film 16 is carried out to expose the pad nitride film 12, thereby reducing step difference made between the cell region and the peripheral region.

Figure 1G:
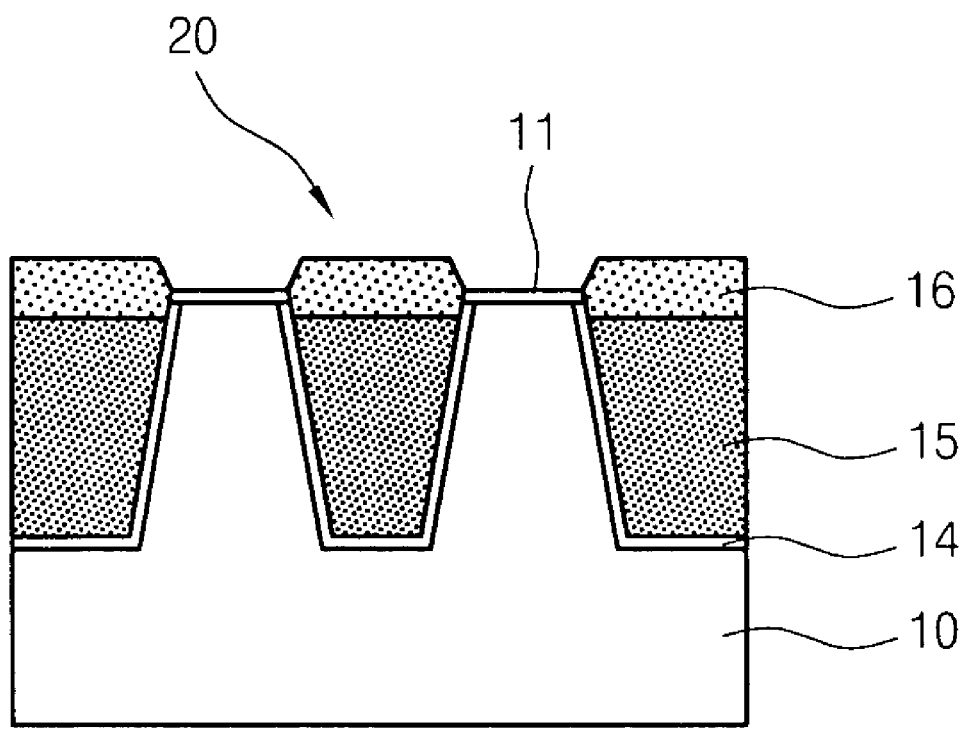

Referring to FIG. 1G, a pad nitride film 12 functioning as a stopping barrier at CMP process is removed, thereby accomplishing an isolation layer 20 having a two layer structure which includes the amorphous silicon film 15 and the oxide film 16.

As described above, the isolation layer of the semiconductor device fabricated according to the present invention has a structure formed by filling up the trench with the amorphous silicon film and the oxide film. Further, because the grain growth of the amorphous silicon film according to a thermal process is not large, conventional problems of stress increase originated from the grain growth of the polysilicon can be basically solved.

The advantages obtained by the present invention will be described below.

As the inner part of the trench has been filled up with the amorphous silicon film partly, a ratio of a height of the trench in relation to a width of the trench becomes small, thereby making the subsequent process of filling up the trench with the oxide film easy.

Further, the Debye length becomes short as the ion concentration becomes high due to subsequent ion implantation, etc., when the inner part of the trench is filled up with the amorphous silicon film, so that the effect of shielding the electric field becomes large as much as the Debye length becomes short, and thereby the inversion of the sidewalls of the trench or the electrical effect of the neighboring cell to the MOSFET becomes small.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a field oxide in a semiconductor device, the method comprising the steps of:
    forming a pad oxide film and a pad nitride film sequentially on a semiconductor substrate defining a cell region and a peripheral region;
    forming a trench on the semiconductor substrate by etching the pad oxide film, the pad nitride film and the substrate;
    forming an oxide film of side walls on a surface of the trench;
    depositing an amorphous silicon film on a resultant substrate inclusive of the trench;
    etching the amorphous silicon film so that the trench is partly filled with amorphous silicon;
    depositing an insulation film on a resultant substrate so that the partly filled trench is filled completely;
    carrying out a CMP process of the insulation film to expose the pad nitride film; and
    removing the pad nitride film.

2. The method as claimed in claim 1, wherein the amorphous silicon film is deposited to a thickness thinner than the depth of the trench.

3. The method as claimed in claim 1, wherein the amorphous silicon film is deposited thicker than half of a width of the trench in the cell region, and is deposited thinner in the peripheral region than the thickness of the amorphous silicon film deposited in the cell region.

4. The method as claimed in claim 3, wherein the amorphous silicon film is deposited to a thickness more than 60 nm, when a width of the trench is 120 nm.

5. The method as claimed in claim 1, wherein the etching of the amorphous silicon film is carried out to remove it to a depth just below the surface of the substrate.

6. The method as claimed in claim 1, wherein the amorphous silicon film is formed in an atmosphere of a mixed gas made of $SiH_4$ and $N_2$ at a deposition temperature ranging from 500 to 600° C.

7. The method as claimed in claim 1, wherein the insulation film is deposited to a thickness ranging from 300 to 5000 Å.

* * * * *